United States Patent
Yamauchi et al.

(10) Patent No.: US 6,320,259 B1
(45) Date of Patent: Nov. 20, 2001

(54) SEMICONDUCTOR DEVICE, AND A MANUFACTURING APPARATUS FOR A METHOD OF MANUFACTURING THE SEMICONDUCTOR DEVICE

(75) Inventors: Shunji Yamauchi; Masahiro Ishitsuka, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/768,369

(22) Filed: Jan. 24, 2001

(30) Foreign Application Priority Data

Jul. 21, 2000 (JP) .................................................. 12-220883

(51) Int. Cl.[7] .......................... H01L 23/48; H01L 23/52; H01L 29/40
(52) U.S. Cl. .............................................. 257/734; 257/678
(58) Field of Search .................................. 257/678, 686, 257/734, 737, 738, 777, 778, 779, 780, 781, 782, 784

(56) References Cited

U.S. PATENT DOCUMENTS 6,242,932 * 6/2001 Hembree ................................ 324/755

* cited by examiner

*Primary Examiner*—David Nelms
*Assistant Examiner*—David Nhu
(74) *Attorney, Agent, or Firm*—Leydig, Voit & Mayer, Ltd.

(57) ABSTRACT

A semiconductor manufacturing apparatus includes a film feeder for sequentially feeding a die bonding film; and a film piece cutter for cutting a die bonding film piece having a shape and dimension from the die bonding film fed by the film feeder. Further, the film piece cutter includes a male blade member which has a cutting blade at circumferential edges, reciprocated along a direction, and a female blade member which has an opening and a receiving blade corresponding to the cutting blade of the male blade member at an inner circumferential edge of the opening. The male blade member and the female blade member are alterable, and thus, it is possible to change the shape and dimension of the film piece defined by the cutting blades.

4 Claims, 5 Drawing Sheets

SEMICONDUCTOR DEVICE, AND A MANUFACTURING APPARATUS FOR A METHOD OF MANUFACTURING THE SEMICONDUCTOR DEVICE

BACKGROUND OF THE INVENTION

The present invention relates to a semiconductor device, and a manufacturing apparatus for and a method of manufacturing the semiconductor device.

Conventionally, in manufacturing a semiconductor device, a die bonding process used. A semiconductor chip, after a dicing process, is placed on a lead frame via a bonding material made of a film material, and is then bonded to the lead frame. In this die bonding process, usually, before the semiconductor chip is placed, a strip-like film material with an adhesive applied to both sides of a base material, is cut into a predetermined size and shape, and, thereafter, is stuck onto the lead frame.

FIG. 7 is a view schematically showing a construction f or forming a film piece having a predetermined size and shape out of a strip-like die bonding film in a die bonding process, incorporated into a conventional semiconductor manufacturing apparatus. In this construction, when a feed roller 65 makes a predetermined rotation, a die bond film 61 is guided to a guide roller 63 and a guide plate 64 from a reel guide 62, and, is fed between a female blade member 71 and a male blade member 72 in a film piece forming unit 70. The male blade member 72 is slidably moved along the direction of an arrow D4, along an inner wall portion of a retaining member 74. When the male blade member 72 moves toward the female blade member 71, the die bonding film 61 is cut. Thus, a rectangular film piece 61a having a predetermined length is formed out of the die bonding film 61.

The film piece 61a is picked up from the distal surface of the male blade member 72, and then, as shown in FIG. 8, is carried and stuck on a lead frame 85. Thereafter, the lead frame 85 is carried at a pitch, and then, a semiconductor chip 81 carried by another unit (not shown) is placed on the film piece 61a, and thereby, is bonded onto the lead frame 85.

According to the aforementioned conventional construction, a length of the film piece 61a is determined by a distance from the end of the die bonding film 61 to a cut position by the film forming unit 70. Thus, the accuracy of the length of the film piece depends upon accuracy in the feed operation of the die bonding film 61. For this reason, it is difficult to achieve accurate control of the length of the film piece 61a. When a semiconductor device (e.g., stacked package, etc.) including a structure particularly requiring size accuracy is manufactured, there is a problem that it is hard to secure minimum quality.

Further, according to the aforementioned conventional construction, width of the film piece 61a is determined by the width of the die bonding film 61. For this reason, in the case of changing the width of the film piece 61 a in accordance with the size of the semiconductor chip 81, the die bonding film 61 must be replaced with another die bonding film. This replacement is a great hindrance to effectively performing the die bonding process. In this case, regarding the width of the film piece 61a, preferably, a tolerance of 0.15 or less is required. In order to obtain the aforementioned accuracy, there is a need for accuracy control of the die bonding film 61.

Furthermore, according to the aforementioned conventional construction, in the case of manufacturing a semiconductor device having a BOC (Board on Chip) structure such that an electrode provided on a back side of a semiconductor chip, and the back side of the lead frame are bonded by a wire inserted into a through-hole in the lead frame, and, thereafter, a portion facing a through-hole of the semiconductor chip and the wire are sealed with a resin, the film piece is stuck onto both sides of the through-hole. Therefore, two film pieces are required with respect to one semiconductor chip. For this reason, the time spent in manufacturing is extended. Moreover, according to the structure of the semiconductor device, there is another problem. In the surface facing the through-hole of the semiconductor chip, and in a process of sealing the wire with a resin, the resin material, such as a potting resin, leaks from a clearance between the ends of the two film pieces. That is, there is a region where no bond is made between the chip and the lead frame.

SUMMARY OF THE INVENTION

The present invention has been made taking the aforementioned problem in the prior art into consideration. It is, therefore, an object of the present invention to provide semiconductor manufacturing apparatus and method which can simplify a size accuracy control of a die bond film piece, and can readily form the die bond film piece into arbitrary dimension and shape in a die bond process.

Moreover, another object of the present invention is to provide a semiconductor device having a BOC structure which can reduce a time spent for manufacture, and is capable of preventing a leakage of a resin material in a seal process.

In order to achieve these objects, in a first aspect of the present invention, there is provided a semiconductor device which is constructed in a manner that a semiconductor chip is bonded on a lead frame having a through-hole extending in a thickness direction via a die bond film piece having a predetermined size and shape, and a portion facing the through-hole of the semiconductor chip and a wire are sealed after an electrode provided on a back side of the semiconductor chip and a back side of the lead frame are bond by the wire inserting into the through-hole, wherein the film piece being formed with a hole having an inner circumferential shape along an outer periphery of the through-hole of the lead frame, and being positioned on the lead frame so that the hole surrounds the circumstance of the through-hole of the lead frame.

In a second aspect of the present invention, there is provided a semiconductor manufacturing apparatus having a construction for forming a film piece to bond a semiconductor chip on a lead frame out of a die bond film in a die bond process of semiconductor chip, and stick the film piece onto a predetermined position on the lead frame, comprising: film feed means for sequentially feeding the die bond film; and film piece forming means for forming a die bond film piece having a predetermined shape and dimension out of the die bond film fed by the film feed means, the film piece forming means including: a male blade member which has a cutting blade at least one portion at circumferential edges on its distal portion and is moved so as to be reciprocated in a predetermined direction; and a female blade member which has an opening portion at the distal portion side of the male blade member and has a receiving blade corresponding to the cutting blade of the male blade member at an inner circumferential edge of the opening portion, wherein the male blade member and the female blade member are alterable, and thereby a shape and dimension of the film piece defined by their cutting blade and receiving blade can be arbitrarily set.

In a third aspect of the present invention, there is provided the semiconductor manufacturing apparatus, wherein the film piece forming means is arranged so that the distal end surface of the male blade member is oriented downward in a substantially vertical direction, and a receiving case is arranged on the lower side of the film piece forming means so as to receive a film scrap which is punched out of the die bond film, and drops therein via the opening portion of the female blade member.

In a fourth aspect of the present invention, there is provided the semiconductor manufacturing apparatus, wherein the film piece forming means is arranged so that the distal end surface of the male blade member is oriented upward in a substantially vertical direction, and so that the formed film piece is held on the distal end surface, and further includes a carrying means for attracting and holding the film piece held on the distal end surface of the male blade member by a pick-up head, and carrying it onto a predetermined position on the lead frame.

In a fifth aspect of the present invention, there is provided a semiconductor manufacturing method comprising the following steps of: forming a film piece for bonding a semiconductor chip on a lead frame out of a die bond film in a die bond process of semiconductor chip; and sticking the film piece onto a predetermined position on the lead frame, the film piece forming means including: a male blade member which has a cutting blade at least one portion at circumferential edges on its distal portion and is moved so as to be reciprocated in a predetermined direction; and a female blade member which has an opening portion at the distal portion side of the male blade member and has a receiving blade corresponding to the cutting blade of the male blade member at an inner circumferential edge of the opening portion, wherein the male blade member and the female blade member constituting the film piece forming means are alterable, and thereby a shape and dimension of the film piece defined by their cutting blade and receiving blade can be arbitrarily set.

Further, in a sixth aspect of the present invention, there is provided the semiconductor manufacturing method, wherein an upwardly opening receiving case is provided below the film piece forming means arranged so that the distal end surface of the male blade member is oriented downward in a substantially vertical direction, and receives a film scrap which is punched out of the die bond film, and drops therein via the opening portion of the female blade member.

Furthermore, in a seventh aspect of the present invention, there is provided the semiconductor manufacturing method, wherein in the film piece forming means arranged so that the distal end surface of the male blade member is oriented upward in a substantially vertical direction, the film piece held on the distal end surface of the male blade member is attracted and held by a pick-up head, and is carried to a predetermined position on the lead frame.

DETAILED DESCRIPTION OF THE PREFERRED EMBODIMENTS

Preferred embodiments of the present invention will be described below with reference to the accompanying drawings.

Figure 1:
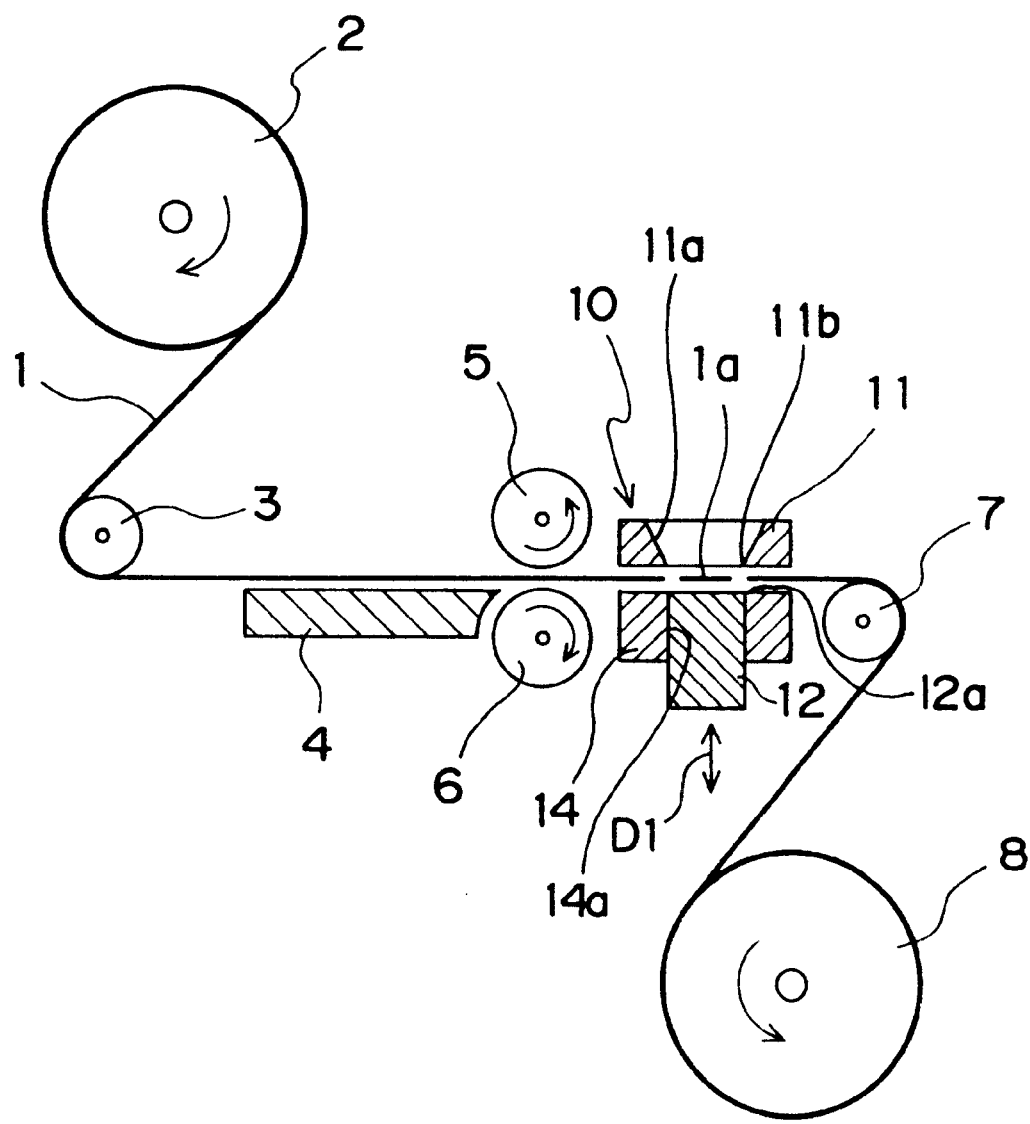
FIG. 1 is a view schematically showing a construction for forming a die bonding film piece from a die bonding film, incorporated into a semiconductor manufacturing apparatus according to a first embodiment of the present invention.

FIG. 1 is a view schematically showing a construction for forming a die bond film piece to bond a semiconductor chip on a lead frame, out of a strip-like die bond film, incorporated into a semiconductor manufacturing apparatus according to a first embodiment of the present invention. In this first embodiment, a semiconductor device (see FIG. 3) having an S-CSP (Stacked Chip Scale Package) is manufactured. The semiconductor device having an S-CSP structure is constructed in a manner that a plurality of semiconductor chips are piled up.

The semiconductor manufacturing apparatus having the construction shown in FIG. 1 has a strip-like die bond film 1 which is formed in a manner that an adhesive is applied onto double sides of a base material, a supply (reel) roller 2 for sequentially supplying the die bond film 1, a motor drive feed roller 5 for feeding the die bond film 1, a film piece forming unit 10 for forming a film piece 1a (see FIG. 2) out of the fed die bond film 1, a winding roller 8 for winding the die bond film 1 after the film piece 1a is removed therefrom. Further, the apparatus has a driven roller 6 which pairs with the feed roller 5, and is rotated by a drive of the feed roller 5, and guide rollers 3 and 7 and a guide plate 4 situated on an upstream side of the feed roller 5, as a member for guiding the die bond film 1 along a predetermined path.

When the feed roller 5 is driven, the die bond film 1 is fed to the film piece forming unit 10 by a predetermined length of the film 1. The film piece forming unit 10 basically includes a male blade member 12 which moves so as to reciprocate in a predetermined direction, a guide member 14 for guiding a reciprocating operation of the male blade member 12, and a female blade member 11 facing the male blade member 12 via the die bond film 1.

In this first embodiment, the male blade member 12 is made of a rod-like member having a rectangular shape in its cross section, and has cutting blade 12a at each of four sides of the circumferential edge on its distal portion. Further, the male blade member 12 is slidably moved to a direction shown by an arrow D1 (vertical direction in this embodiment) along an inner wall portion 14a of the guide member 14. On the other hand, the female blade member 11 has an opening portion 1a opening in the distal side of the male blade member 12, and is provided with a receiving blade 11b corresponding to the cutting blade 12a of the male blade member 12 side at each of four side of the inner circumferential edge of the opening portion 11a. Further, the female blade member 11 is previously arranged so that the receiving blade 11b presses in contact with the die bond film 1 in forming a film piece.

In the film piece forming unit 10, in a state that the die bond film 1 is fed between the male blade member 12 and the female blade member 11, when the male blade member 12 is moved toward the female blade member 11, the cutting blade 12a of the male blade member 12 and the receiving blade 11b of the female blade member 11 are engaged with each other, and then, the film piece 1a (see FIG. 2) having a shape and dimension defined by these receiving blade 11b and cutting blade 12a is punched out of the die bond film 1. In this film piece forming unit 10, the shape and dimension of the formed film piece 1a is defined by the receiving blade 11b and cutting blade 12a. Therefore, an accuracy in the width and lengthwise dimension of the film piece 1a is very high and stable without depending upon an accuracy in a feed operation of the die bond film 1.

Further, in the film piece forming unit 10, the male blade member 12 and the female blade member 11 are alterable variously, and thereby, it is possible to arbitrarily set a shape and dimension of the film piece 1a defined by the cutting blade 12a and the receiving blade 11b. In this first embodiment, as described later referring now to from FIG. 3, in order to manufacture a semiconductor device having a structure such that a semiconductor chip having different dimension is piled up, a film piece 1a having different dimension is required. However, the shape and dimension of the film piece 1a can be arbitrarily set; therefore, it is possible to readily manufacture the aforementioned semiconductor device. Thus, it is possible to produce the film piece 1a having a desired dimension in a simple process, and thereby, to improve a productivity of a semiconductor manufacturing apparatus.

Figure 2:
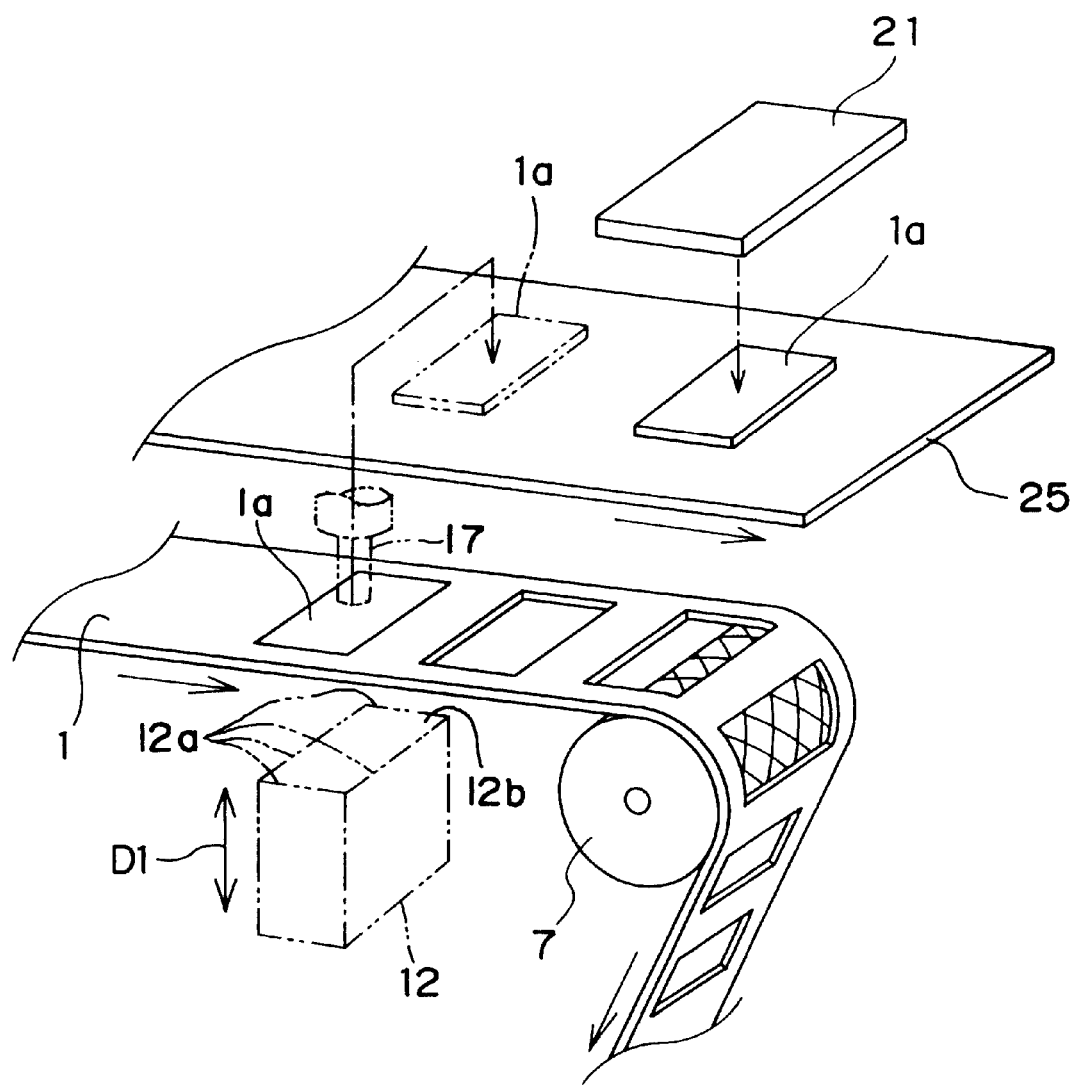
FIG. 2 is a view for explaining a procedure for carrying the die bonding film piece on a lead frame.

With reference to FIG. 2, the following is a description on a procedure in the case where the film piece 1a formed by the film forming unit 10 is carried on a lead frame 25. In this case, as seen from FIG. 2, in order to clarify the drawing, the surface of the guide roller 7 is shown with hatching.

When the male blade member 12 is moved toward the female blade member 11 (see FIG. 1), a film piece 1a having a shape and dimension defined by the cutting blade 12a on the male blade member 12 side and the receiving blade 11b of the female blade member 11 side is punched out of the die bond film 1. In this first embodiment, the film piece forming unit 10 is arranged so that a distal surface 12b of the male blade member 12 is oriented upward in a vertical direction. Thus, the film piece 1a punched out of the die bond film 1 is held on the distal surface 12b of the male blade member 12 as it is. Thereafter, the film piece 1a is attracted and held by a pick-up head 17 (shown by an imaginary line), and then, is carried on the lead frame 25 so as to be stuck thereon. In the aforementioned apparatus, the film piece 1a is high accurately carried on a predetermined position on the lead frame 25. The film piece 1a is stuck onto the lead frame 25, and thereafter, the lead frame 25 is carried at a pitch, and a semiconductor chip 21 carried by another unit (not shown) is placed on the film piece 1a so as to be bonded onto the lead frame 25. In this case, the film piece 1a is picked up, and thereafter, an unnecessary die bond film 1 is guided by the guide roller 7, and then, is wound on the winding roller 8 (see FIG. 1) so as to be withdrawn.

Figure 3:
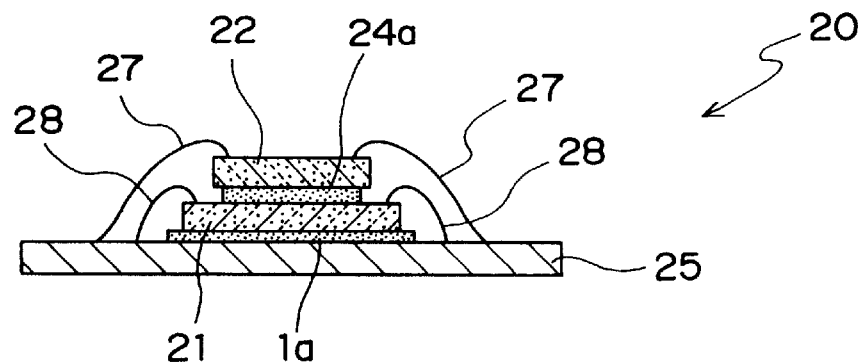
FIG. 3 is a longitudinal cross sectional view showing a semiconductor device after a die bonding process and a wire bonding process.

FIG. 3 is a longitudinally cross sectional view showing a semiconductor device after a die bond process and a wire bond process according to a first embodiment of the present invention. As shown in FIG. 3, a semiconductor device 20 has an S-CSP structure such that two semiconductor chips 21 and 22 are piled up on the lead frame 25. In this structure, the lower stage side semiconductor chip 21 is placed on the lead frame 25 via the film piece 1a, and further, the upper stage side semiconductor chip 22 smaller than the lower stage side semiconductor chip 21 is placed on the semiconductor chip 21 via a film piece 24a. Moreover, these lower stage side and lower stage side semiconductor chips 21 and 22 are bonded onto the lead frame 25 via wires 28 and 27, respectively.

In such semiconductor device 20, usually, at the upper circumferential edge of the lower stage side semiconductor chip 21, in order to secure an electrode (not shown) area of the bonding point of the wire 28, and in order to control a difference (i.e. overhang) in stage between the lower stage side semiconductor chip 22 and the film piece 24a on the basis of a mold formability, a high accuracy is required in sticking the film piece 24a onto the lower stage side semiconductor chip 21. Therefore, a high accuracy in an outer dimension of the film piece 24a is also required. In the aforementioned film piece forming unit, a shape and dimension of the formed film piece 24a is defined by the receiving blade and the cutting blade; therefore, in accordance with the request, it is possible to obtain a high accuracy in the dimension of the film piece. Moreover, like the semiconductor device 20, in the case where film pieces 1a and 24a having different dimension are required, the male blade member and the female blade member of the film piece forming unit are alterable, and thereby, it is possible to arbitrarily set a shape and dimension of the film piece 1a, and thus, to readily obtain a desired film piece.

The first embodiment has described the case where only one film piece 1a is formed by one operation of the male blade member 12 and the female blade member of the film piece forming unit 10. However, the present invention is not limited to this first embodiment, and a plurality of film pieces 1a may be punched out of the die bond film 1 by one operation of the male blade member and the female blade member.

Moreover, the first embodiment has described the case where in the film piece forming unit 10, the film piece 1a is punched in four sides. However, the present invention is not limited to this first embodiment, and four sides constituting a rectangular shape is divided into sides along a widthwise direction and a feed direction of the die bond film 1, and then, the die bond film 1 may be cut by two sides so as to form a rectangular film piece.

Next, another embodiment of the present invention will be described below. In this embodiment, like reference numerals are used to designate the same parts as the first embodiment, and the details are omitted.

Figure 4:
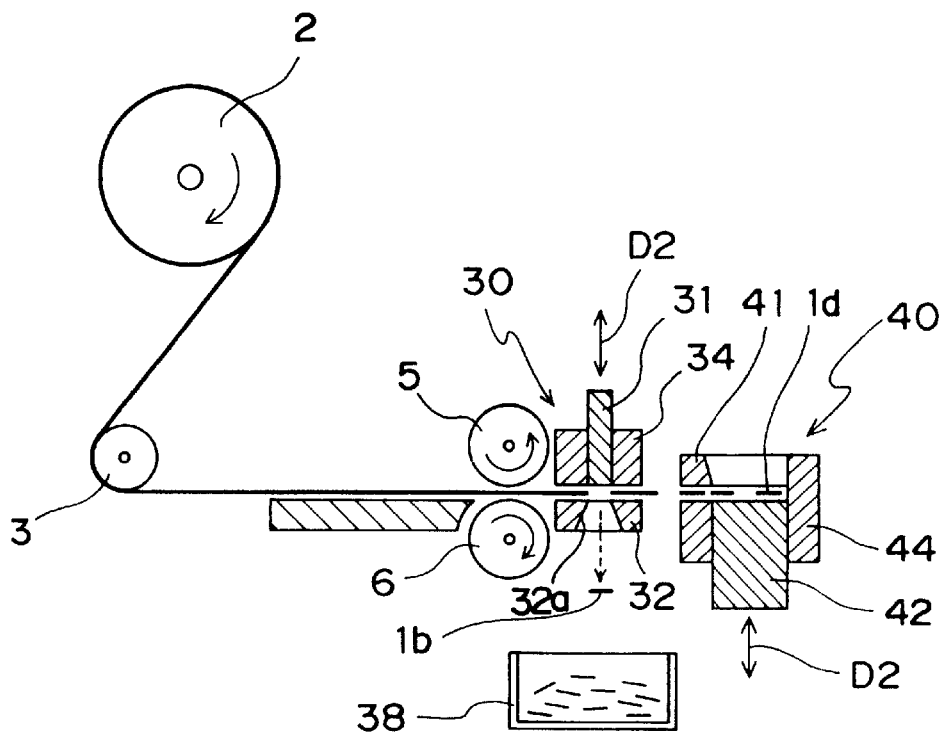
FIG. 4 is a view schematically showing a construction for forming a die bonding film piece from a die bonding film, incorporated into a semiconductor manufacturing apparatus according to a second embodiment of the present invention.

FIG. 4 is a view schematically showing a construction for forming a die bond film piece out of a die bond film, incorporated into a semiconductor manufacturing apparatus according to a second embodiment of the present invention. In this second embodiment, the following semiconductor device is manufactured. More specifically, the semiconductor device has a BOC structure such that an electrode provided on the back side of a semiconductor chip and the back side of the lead frame are bonded by a wire inserting into the through-hole formed in.the lead frame, and thereafter, a portion facing the through-hole of the semiconductor chip and the wire are sealed by a resin.

The semiconductor manufacturing apparatus of this second embodiment is provided with a first film piece forming unit 30 for forming a rectangular hole in the die bond film 1, and a second film piece forming unit 40 for cutting a film piece 1d including the hole from the distal end side of the die bond film 1. The first film piece forming unit 30 has the substantially same structure as the film piece forming unit 10 described in the first embodiment. In this second embodiment, a female blade member 32 is arranged on a lower side of the die bond film 1, and a male blade member 31 and its guide member 34 are arranged on an upper side of the die bond film. The male blade member 31 is moved so as to be reciprocated to a direction shown by an arrow D2 (vertical direction).

In the first film piece forming unit 30, in a state that the die bond film 1 is fed between the male blade member 31 and the female blade member 32, when the male blade member 31 is moved toward the female blade member 32, a cutting blade of the male blade member 31 and a receiving blade of the female blade member 32 are engaged with each other, and then, a film scrap 1b having a rectangular shape defined by these cutting blade and receiving blade is punched out of the die bond film 1. Thus, the die bond film 1 is formed with a rectangular hole 1c (see FIG. 5). The hole 1c has an inner circumferential shape along an outer circumference of a through-hole 25a formed in the lead frame 25.

The punched film scrap 1b downwardly drops via an opening portion 32a of the female blade member 32, and then, is received in a receiving case 38 which is arranged on a lower side of the first film piece forming unit 30 and has an opening at its upper portion.

The second film piece forming unit 40 is arranged on a downstream side of the first film piece forming unit 30, and basically has a male blade member 42 which is moved so as to be reciprocated to a predetermined direction, a guide member 44 for guiding a reciprocating operation of the male blade member 42, and a female blade member 41 which faces the male blade member 42 via the die bond film 1. The male blade member 42 is made of a rod-like member having a rectangular shape in its cross section, and has cutting blade 12a at one side of the circumferential edge (in this case, a side situated on the uppermost upstream side). Further, the male blade member 42 is slidably moved to a direction shown by an arrow D3 (vertical direction in this embodiment) along an inner wall portion of the guide member 44. On the other hand, the female blade member 41 is provided with a receiving blade corresponding to the cutting blade of the male blade member 42.

In the film piece forming unit 40, in a state that the die bond film 1 is fed between the male blade member 42 and the female blade member 41, when the male blade member 42 is moved toward the female blade member 41, a cutting blade of the male blade member 42 and a receiving blade of the female blade member 41 are engaged with each other, and then, the film piece id having a predetermined length including the hole formed in the first film piece forming unit 30 is cut out of the distal end side of the die bond film 1. Thus, a frame-like film piece 1d is formed.

Figure 5:
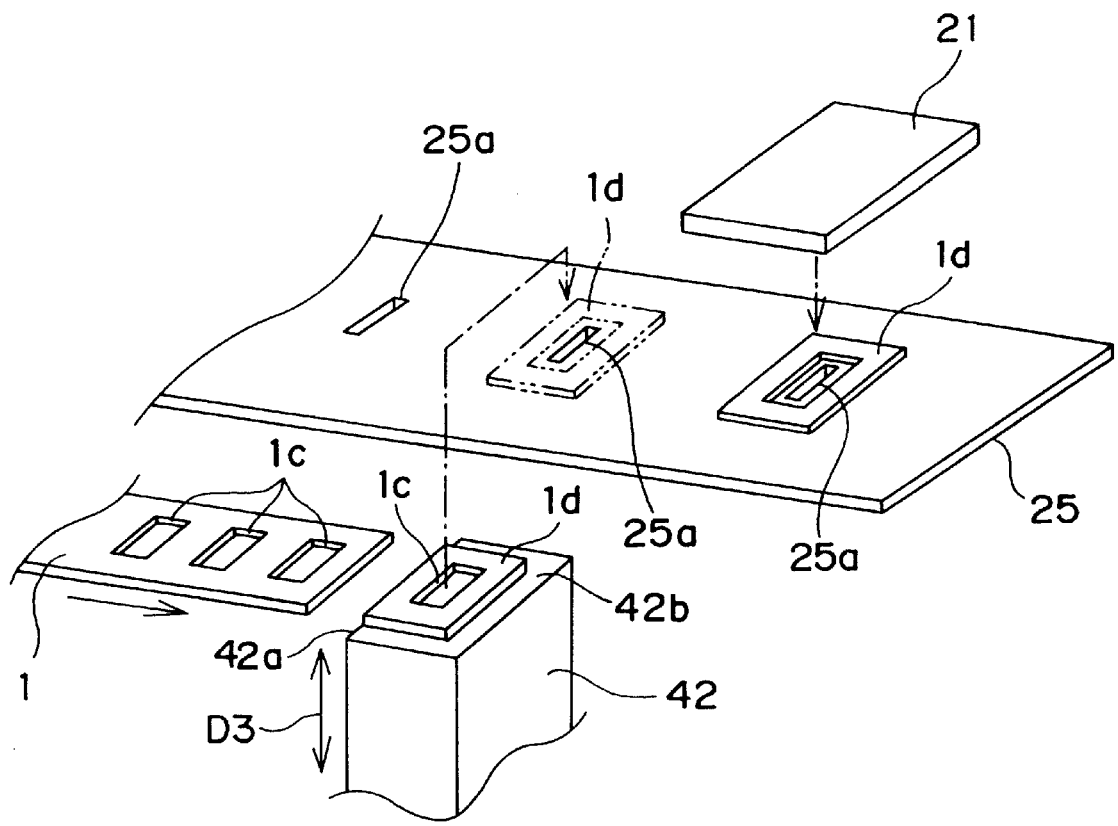
FIG. 5 is a view for explaining a procedure for carrying the die bonding film piece on a lead frame according to the second embodiment.

With reference to FIG. 5, the following is a description on a procedure in the case where the film piece 1d formed by the second film piece forming unit 40 is carried on the lead frame 25. In a state that the die bond film 1 including the hole 1c is fed between the female blade member 41 (see FIG. 4) and the male blade member 42, when the male blade member 42 is upwardly moved, the cutting blade 42a of the male blade member 42 and the receiving blade (not shown) of the female blade member 41 are engaged with each other, and then, the die bond film 1 is cut along the widthwise direction with a predetermined length. Thus, the film piece 1d having a predetermined length including the hole 1c is cut out of the distal end side of the die bond film 1.

The film piece forming unit 40 is arranged so that a distal end surface 42b of the male blade member 42 is oriented upward in a vertical direction, and thereby, the cut film piece 1d is held on the distal end surface 42b of the male blade member 42 as it is. Thereafter, the film piece 1d is attracted and held by the same pick-up head (not shown) as the case of the first embodiment, and then, is carried on a predetermined position on the lead frame 25.

In this second embodiment, the lead frame 25 is formed with a through-hole 25a extending in a thickness direction thereof. The film piece 1d thus carried is positioned on the lead frame 25 so that the hole 1c surrounds the entire circumference of the through-hole 25a, and then, is stuck onto the lead frame 25. After the film piece 1d is stuck, the lead frame 25 is carried at a pitch, and then, the semiconductor chip 21 attracted and carried by another unit (not shown) is sequentially placed on the film piece 1d so as to be bonded onto the lead frame 25.

Figure 6:
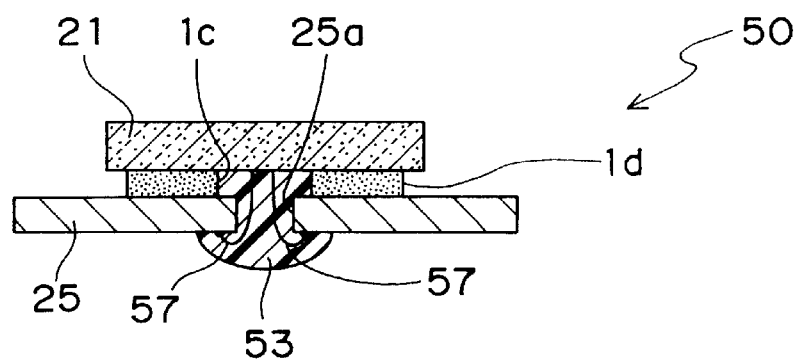
FIG. 6 is a longitudinal sectional view showing a semiconductor device after a die bonding process and a wire bonding process according to the second embodiment.
Figure 7:
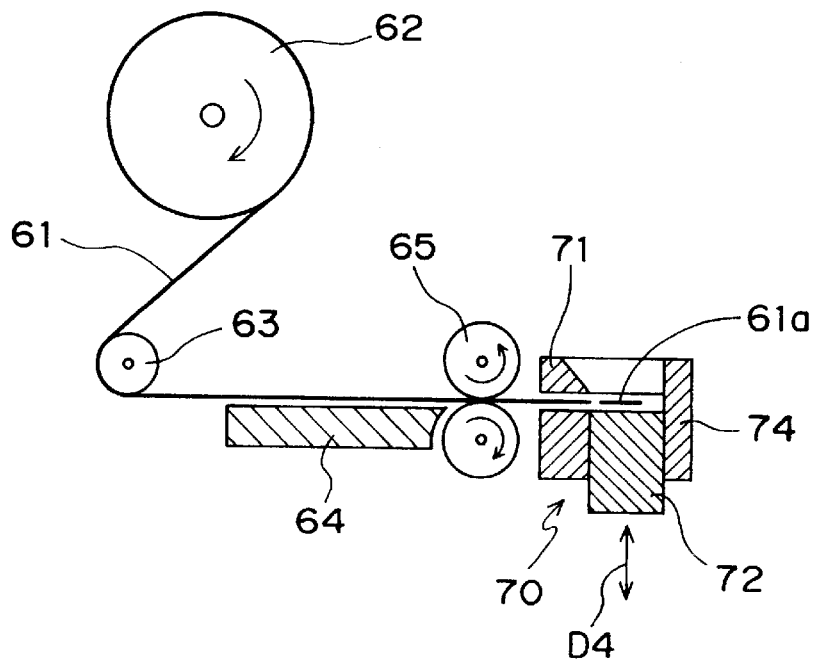
FIG. 7 is a view schematically showing a construction for forming a die bond film piece, incorporated into a conventional semiconductor manufacturing apparatus.
Figure 8:
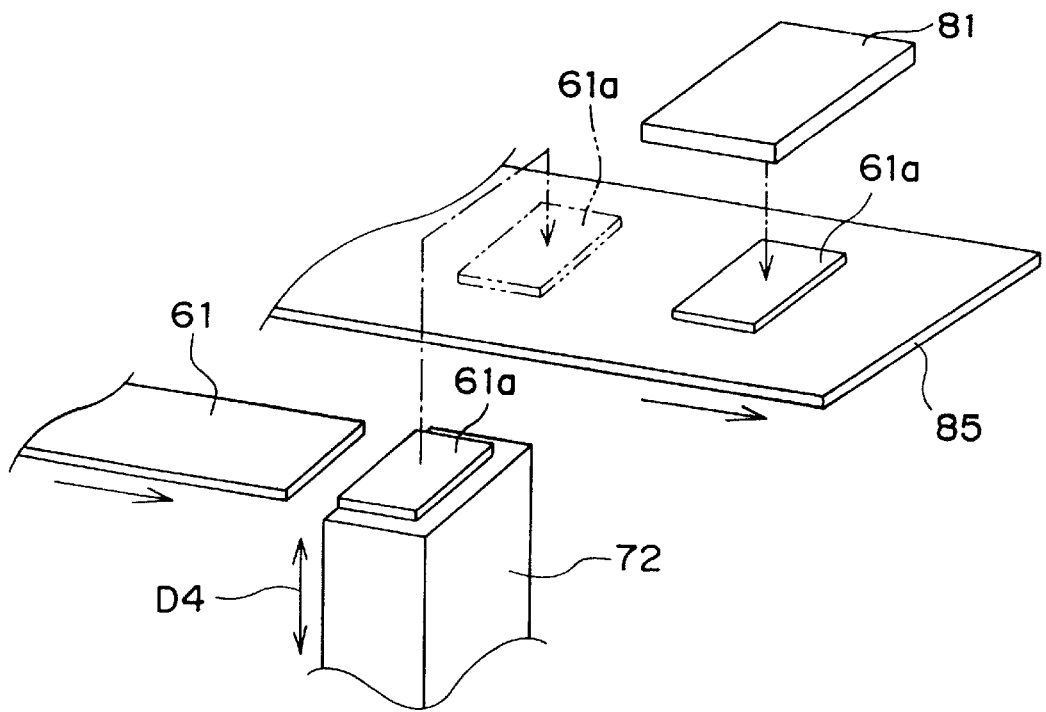
FIG. 8 is a view to explain a procedure for carrying a conventional film piece on a lead frame.

FIG. 6 is a longitudinal sectional view showing a semiconductor device after a die bond process and a wire bond process according to the second embodiment. A semiconductor device 50 has the following structure; more specifically, in a state that the semiconductor chip 21 is bonded onto the lead frame 25 via the film piece 1d, an electrode (not shown) provided on the back side of the semiconductor chip 21 and the back side of the lead frame 25 are bonded by a wire 57 inserting into the through-hole 25a formed in the lead frame 25, and further, a portion corresponding to the through-hole 25a of the semiconductor chip 21 and the wire 57 are sealed by a liquid potting resin 53.

In the semiconductor device 50, the hole 1c of the film piece 1d is positioned so as to surround the circumstance of the through-hole 25a of the lead frame 25, so that the film piece 1d can fully seal the through-hole 25a at the surface side of the lead frame 25. Therefore, after a seal process using the potting resin 53, it is possible to prevent the potting resin from leaking from a clearance between the semiconductor chip 21 and the lead frame 25.

The present invention is not limited to the embodiments, and of course, various modifications and changes in design may be made in a range of scope without diverging from the gist and sprit of the present invention. In the embodiments, as the male blade member and the female blade member of the film piece forming unit, their cutting blade and receiving blade have shapes such as O-shape and U-shape other than the rectangular shape. Moreover, the embodiment has described the case where the film piece 1d used in the semiconductor device having a BOC structure is formed into a frame shape. However, the present invention is not limited to this embodiment, and the film piece 1d may be formed into any other form so long as it is possible to prevent a leakage of a potting resin.

As is obvious from the above description, according to the present invention, the formed film piece has a hole having an inner circumferential shape along an outer periphery of the through-hole formed in the lead frame, and the hole is positioned on the lead frame so as to surround the surroundings of the through-hole. Therefore, the through-hole is fully sealed at the surface side of the lead frame, and after a sealing process using a potting resin, it is possible to securely prevent the potting resin from leaking from a clearance between the semiconductor chip and the lead frame.

Also, according to the present invention, the male blade member and the female blade member of the film piece forming means are alterable, and thereby, it is possible to arbitrarily set a shape and dimension of the film piece defined by their cutting blade and receiving blade. Therefore, it is possible to readily form a film piece having different dimension and shape. Further, it is possible to produce a film piece having a desired shape and dimension by a simple process, and thus, to improve a productivity of the semiconductor manufacturing apparatus. Furthermore, in this case, the shape and dimension of the formed film piece are defined by the receiving blade and the cutting blade; therefore, an accuracy of the lengthwise dimension of the film piece is a very high and stable without depending upon an accuracy of a feed operation of the die bond film.

Further, according to the present invention, the film piece forming means is arranged so that the distal end surface of the male blade member is oriented downward in a substantially vertical direction, and a receiving case is arranged on the lower side of the film piece forming means so as to receive a film scrap which is punched out of the die bond film, and then, drops therein via the opening portion of the female blade member. Therefore, it is possible to readily receive and recover the film scrap produced in the film piece forming process.

Furthermore, according to the present invention, the film piece forming means is arranged so that the distal end surface of the male blade member is oriented upward in a substantially vertical direction, and so that the fomred film piece is held on the distal end surface. Further, the film forming means has a carrying means for attracting and holding the film piece held on the distal end surface of the male blade member by a pick-up head, and carrying it onto a predetermined position on the lead frame. Therefore, it is possible to high accurately carry the formed film piece onto a predetermined position on the lead frame.

What is claimed is:

1. A semiconductor device including
   a semiconductor chip bonded to a lead frame having a through-hole, extending in a thickness direction of the lead frame, by a die bonding film piece having a size and shape, a portion of the die bonding film facing the through-hole, and
   a wire bonded to the semiconductor chip and sealed in a resin after an electrode located on a back side of the semiconductor chip and a backside of the lead frame are bonded to the wire, with the wire inserted into the through-hole, the film piece having a hole having an inner circumferential shape located along an outer periphery of the through-hole of the lead frame, and being positioned on the lead frame so that the hole surrounds the through-hole of the lead frame.

2. A semiconductor manufacturing apparatus for forming a film piece to bond a semiconductor chip on a lead frame from a die bonding film in a die bonding process, and sticking the film piece onto the lead frame, comprising:
   film feed means for sequentially feeding the die bonding film; and
   film piece forming means for forming a die bonding film piece having a shape and dimension from the die bonding film fed by the film feed means, the film piece forming means including:
      a male blade member which has a cutting blade at circumferential edges on a distal portion and reciprocating along a direction; and
      a female blade member which has an opening adjacent the distal portion of the male blade member and a receiving blade corresponding to the cutting blade of the male blade member at an inner circumferential edge of the opening, wherein the male blade member and the female blade member are alterable, so that the shape and dimension of the film piece defined by the cutting blade and the receiving blade can be changed.

3. The semiconductor manufacturing apparatus according to claim 2, wherein a distal end surface of the male blade member is oriented downward, in a substantially vertical direction, and including a receiving case at a lower side of the film piece forming means for receiving film scrap punched out of the die bonding film and dropping into the receiving case through the opening of the female blade member.

4. The semiconductor manufacturing apparatus according to claim 2, wherein a distal end surface of the male blade member is oriented upward in a substantially vertical direction so that the formed film piece is held on the distal end surface, and including carrying means having a pick-up head for attracting and holding a film piece held on the distal end surface of the male blade member, and carrying the film piece to the position on the lead frame.

* * * * *